United States Patent
Bhosale et al.

(10) Patent No.: US 10,461,248 B2
(45) Date of Patent: *Oct. 29, 2019

(54) BOTTOM ELECTRODE FOR MRAM APPLICATIONS

(71) Applicant: International Business Machines Corporation, Armonk, NY (US)

(72) Inventors: Prasad Bhosale, Slingerlands, NY (US); Raghuveer R. Patlolla, Guilderland, NY (US); Michael Rizzolo, Albany, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/997,904

(22) Filed: Jun. 5, 2018

(65) Prior Publication Data

US 2018/0287051 A1 Oct. 4, 2018

Related U.S. Application Data

(62) Division of application No. 15/455,754, filed on Mar. 10, 2017, now Pat. No. 10,096,769.

(51) Int. Cl.
*H01L 21/00* (2006.01)
*H01L 43/12* (2006.01)
*H01L 43/08* (2006.01)

(52) U.S. Cl.
CPC .............. *H01L 43/12* (2013.01); *H01L 43/08* (2013.01)

(58) Field of Classification Search
None
See application file for complete search history.

(56) References Cited

U.S. PATENT DOCUMENTS

| | | |
|---|---|---|
| 6,150,260 A | 11/2000 | Roy |
| 6,828,639 B2 | 12/2004 | Nejad et al. |
| 7,064,064 B2 | 6/2006 | Chen et al. |
| 7,482,261 B2 | 1/2009 | Yang |
| 7,611,912 B2 | 11/2009 | Hong et al. |
| 7,808,106 B1 | 10/2010 | Eisenbraun |
| 7,838,436 B2 | 11/2010 | Xiao et al. |
| 7,999,360 B2 | 8/2011 | Hong et al. |
| 8,610,276 B2 | 12/2013 | Yang et al. |

(Continued)

OTHER PUBLICATIONS

List of IBM Patents or Patent Applications Treated as Related; (Appendix P), Date Filed Jun. 5, 2018; 2 pages.

(Continued)

*Primary Examiner* — Reema Patel
(74) *Attorney, Agent, or Firm* — Cantor Colburn LLP; Vazken Alexanian

(57) ABSTRACT

A substantially flat bottom electrode for magnetoresistive random access memory (MRAM) devices includes three components: a recessed bulk conductive material such as copper, a conductive liner lining the recess, and a cap layer, wherein the conductive liner is a harder material than the cap layer. The cap layer and the dielectric layer are coplanar having a height differential of less than 3 nanometers. The conductive liner has a lower chemical mechanical planarization removal rate. Also provided are processes for forming the bottom electrode.

13 Claims, 4 Drawing Sheets

(56) References Cited

U.S. PATENT DOCUMENTS

| | | |
|---|---|---|
| 8,673,654 B2 | 3/2014 | Hong et al. |
| 9,406,365 B1 | 8/2016 | Jeong et al. |
| 10,096,769 B2 * | 10/2018 | Bhosale .................. H01L 43/02 |
| 2002/0180052 A1 | 12/2002 | Layadi et al. |
| 2007/0173061 A1 | 7/2007 | Hong |
| 2009/0289368 A1 | 11/2009 | Yang et al. |
| 2015/0255329 A1 | 9/2015 | Ren et al. |
| 2015/0255339 A1 | 9/2015 | Zhang et al. |
| 2016/0284985 A1 | 9/2016 | Shen et al. |

OTHER PUBLICATIONS

Prasad Bhosale, et al., Pending U.S. Appl. No. 15/455,754, entitled "Bottom Electrode for MRAM Applications," filed Mar. 10, 2017.

\* cited by examiner

BOTTOM ELECTRODE FOR MRAM APPLICATIONS

DOMESTIC PRIORITY

This application is a DIVISIONAL of U.S. application Ser. No. 15/455,754, filed Mar. 10, 2017, the contents of which are incorporated by reference herein in its entirety.

BACKGROUND

This invention relates generally to formation of MRAM (magnetic random access memory) cells in a semiconductor device, and more particularly, to magnetic tunneling junction (MTJ) devices and methods of fabricating a bottom electrode for such a device, wherein the method and structure provides a bottom electrode having a flat surface coplanar to the dielectric.

The MTJ device is essentially a magnetic switch which permits or prevents the flow of spin-polarized tunneling electrons (i.e. the device has a low or a high resistance) through a very thin dielectric spacer layer formed between an upper and lower electrode. Because the tunneling is spin-polarized, the current depends upon the relative orientation of the magnetizations of magnetic layers above and below the spacer layer. One of the two magnetic layers (the pinned layer) in the MTJ has its magnetization fixed in direction, while the other layer (the free layer) has its magnetization free to move in response to an external switching stimulus. Planarity variations between the bottom electrode and the adjacent dielectric prior to fabrication of the MTJ devices can cause topography, which causes poor grain growth and defects in the deposited MTJ.

SUMMARY OF THE INVENTION

The present invention provides magnetoresistive random access memory (MRAM) devices and processes for forming a bottom electrode in a MRAM device.

In one or more embodiments, a MRAM device includes a bottom electrode embedded within a dielectric layer. The bottom electrode includes a recessed metal conductor, a conductive liner lining a recess defined by the recessed metal conductor, and a cap material filling the recess to provide a top surface coplanar to a top surface of the dielectric layer. A height differential between the top surfaces of the cap layer and the dielectric layer is less than about 3 nanometers. The conductive liner is selected to have a hardness greater than the cap layer. A magnetic tunnel junction (MTJ) stack is disposed on the bottom electrode and a top electrode is disposed on the MTJ stack.

In one or more embodiments, a MRAM device includes a bottom electrode embedded within a dielectric layer, the bottom electrode including a recessed metal conductor, a ruthenium conductive liner lining a recess defined by the recessed metal conductor, and a tantalum nitride cap material filling the recess to provide a top surface coplanar to a top surface of the dielectric layer having a height differential between the top surfaces of the tantalum nitride and the dielectric layer of less than about 3 nanometers. A magnetic tunnel junction (MTJ) stack is disposed on the bottom electrode and a top electrode is disposed on the MTJ stack.

A process of forming a bottom electrode in a MRAM device includes forming a recessed metal conductor in a dielectric layer; depositing a conductive liner material in a recess of the recessed metal conductor and the dielectric layer; depositing tantalum nitride in the recess on the conductive liner material and the dielectric layer; and polishing the tantalum nitride to the dielectric layer with a chemical mechanical planarization process, wherein a height differential between the tantalum nitride surface and the dielectric layer surface is less than 3 nanometers, wherein the conductive liner material is harder than the tantalum nitride.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
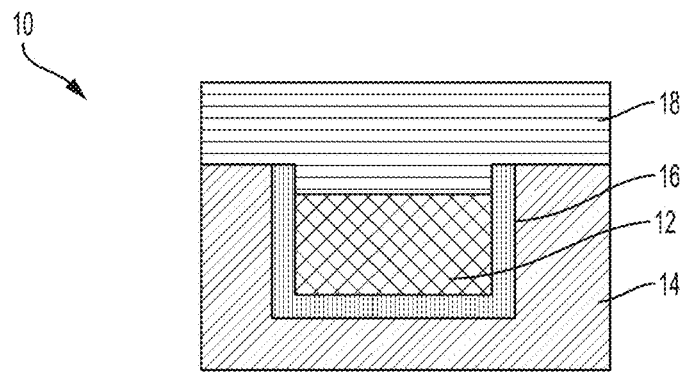
FIG. 1 is a schematic cross sectional view depicting a bottom electrode and cap structure formed in a dielectric layer prior to a planarization process.

It will be appreciated that for simplicity and clarity of illustration, elements shown in the drawings have not necessarily been drawn to scale. For example, the dimensions of some of the elements can be exaggerated relative to other elements for purpose of clarity.

DETAILED DESCRIPTION

The present invention is generally directed to methods and structures for forming a bottom electrode for subsequent fabrication of an MTJ device thereon. Bottom electrode structures of an MTJ device typically include a recessed bulk metal conductive line embedded within a dielectric layer. The bottom electrode structure further includes a cap layer such as tantalum nitride disposed within the recess. To form a good, low-resistance MTJ on the bottom electrode structure requires good control of the surface roughness of the bottom electrode.

Processes for forming the bottom electrode for MTJ device fabrication thereon typically include a chemical mechanical planarization (CMP) process subsequent to the self-aligned deposition of the cap layer into the recess of the recessed metal conductor to planarize the surfaces of the cap layer and the adjacent dielectric layer so as to provide a flat and coplanar surface.

CMP is a planarization process for smoothing surfaces with the combination of chemical and mechanical forces. The process generally includes an abrasive and corrosive chemical slurry (commonly a colloid) in conjunction with a polishing pad and retaining ring, typically of a greater diameter than the wafer. The pad and wafer are pressed together by a dynamic polishing head and held in place by a plastic retaining ring. The dynamic polishing head is rotated with different axes of rotation. This removes excess material and tends to even out any irregular topography, making the wafer flat or planar. However, CMP of the bottom electrode structure to planarize the surface after formation of the cap layer results in dielectric dishing (also referred to as dielectric recess formation) within the dielectric material. The dielectric dishing results in unwanted topography that is transferred during subsequent fabrication of the MTJ stack. Moreover, the resulting topography deleteriously causes non-columnar grain growth and increased defectivity to occur.

The present invention is directed to substantially eliminating the dielectric recess by providing a substantially flat and coplanar surface having a roughness of less than about 3 nanometers (nm) in one or more embodiments, a surface roughness of less than about 2 nm in one or more other embodiments, and a surface roughness of less than about 1 nm in still other embodiments.

As used herein, the terms "invention" or "present invention" are non-limiting terms and not intended to refer to any single aspect of the particular invention but encompass all possible aspects as described in the specification and the claims.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

Figure 2:
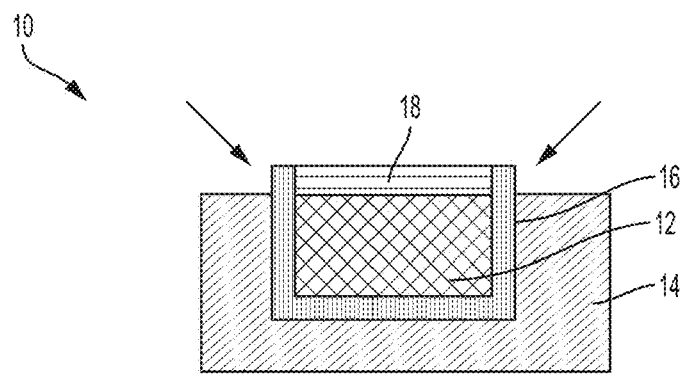
FIG. 2 is schematic cross sectional view of the partially completed integrated circuit structure of FIG. 1 subsequent to a planarization process, wherein the dielectric is recessed relative to the top of the neighboring metal.

FIGS. 1 and 2 depict cross sectional views of a typical bottom electrode structure 10 before and after a planarization process, respectively, to remove the excess cap layer material and planarize the underlying surfaces. In FIG. 1, the before structure 10 includes a recessed bulk metal conductor 12 embedded within a dielectric layer 14. A barrier layer 16 is intermediate the bulk conductor layer and the dielectric layer 14 so as to prevent electromigration of the metal conductor into the dielectric. The cap layer material 18 fills the recess. Excess cap material resulting from the blanket deposition overlies the bulk metal conductor 12 and the dielectric layer 14.

Optionally, in one or more embodiments, a liner layer (not shown), such as, for example, cobalt, ruthenium, alloys thereof, or the like can be positioned between the barrier layer 16 and the metal conductor 12. For example, cobalt can be present in one or more thin layers as a liner layer (e.g., 1 to 100 angstroms) between a tantalum nitride barrier layer and a copper metal conductor.

The before structure can be formed by a damascene process, which generally includes lithographically patterning and etching the dielectric layer 14 to form openings in the dielectric layer in a manner known in the art. A conformal thin barrier 16 layer is then deposited into the patterned openings. A bulk metal conductor, such as copper, is subsequently deposited using, in one or more embodiments, a chemical vapor deposition (CVD) technique, plasma enhanced CVD, vacuum evaporation, electroplating, or sputtering technique. Next, a chemical-mechanical polishing (CMP) process is utilized to planarize the different features across the surface of the dielectric layer 14. The CMP planarization process applies a substantially uniform material removal rate of the bulk conductor and the dielectric material across a plane of the substrate surface, which substantially ensures that the substrate is uniformly reduced in height across the plane of the substrate surface. A wet etch process can then be used to recess the metal conductor 12 relative to the dielectric layer 14 by selectively removing a portion of the metal conductor. A cap layer 18 such as tantalum nitride is then blanket deposited onto the substrate, thereby filling the recess and serving to protect the conductor from electromigration, moisture, oxidation, and the like.

FIG. 2 shows the structure 10 subsequent to the planarization process, e.g., post CMP. As indicated by arrows 20, the dielectric material 14 adjacent to the conductive material 12 is not coplanar with the top surface of the cap layer 18 overlaying the conductive line 12. In reality, the recess has an arcuate shape and resembles a radius of a dish, hence reference to dielectric dishing.

Formation of the after structure of FIG. 2 includes subjecting the substrate shown in FIG. 1 to a planarization process such as CMP to remove the excess cap layer and planarize the surface. Because the material selected for the cap layer is typically more resistant to the CMP process, dielectric dishing results within the adjacent dielectric layer since this material is more easily removed than the cap layer material. That is, the surface after planarization is not very flat in the adjacent regions of dielectric material between conductive lines. When the MTJ device is later formed on the bottom electrode, the topography caused by the dielectric dishing results in non-columnar grain growth during a subsequent annealing step, which interferes with effective formation of a bottom synthetic anti-ferromagnetic layer in the MTJ stack.

Figure 3:
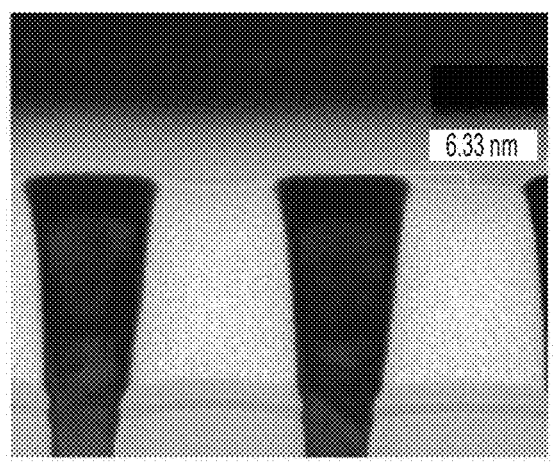
FIG. 3 is a photomicrograph depicting a dielectric recess subsequent to planarization of a bottom electrode and cap structure formed in a dielectric layer.

FIG. 3 provides a cross sectional micrograph showing the dishing in the dielectric layer between adjacent conductive lines subsequent to CMP, which is also referred to as the dielectric recess problem. In the illustrated cross section, the difference between the heights from the planarized top surface of the cap layer to the bottom of the dielectric recess in the dielectric layer subsequent to CMP was 6.33 nm. Because of the dielectric recess, the granularity in the bottom electrode of the MTJ is deleteriously affected during an annealing process.

Figure 4:
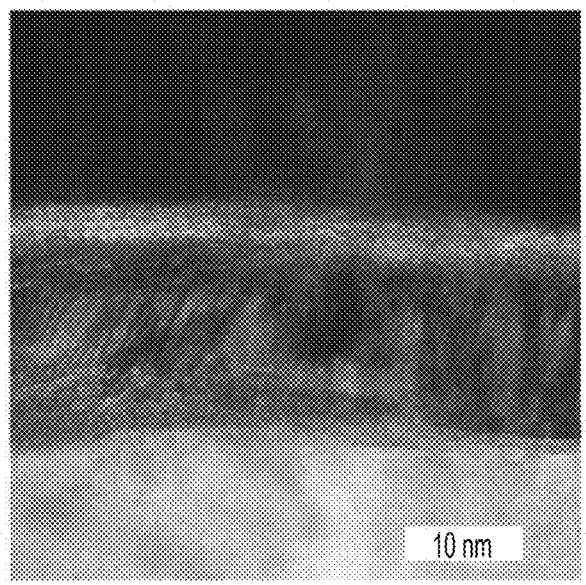
FIG. 4 is a photomicrograph depicting non-columnar grain formation in a magnetic tunnel junction device formed on a substrate exhibiting dielectric recess subsequent to planarization of a bottom electrode and cap structure formed in a dielectric layer.

FIG. 4 provides a cross sectional micrograph of an MTJ device fabricated on a structure where dielectric dishing was evident. When the subsequent MTJ is deposited, the topography causes grain growth to become poor as evidenced by non-columnar grain growth and increased defectivity, which interferes with effective formation of the bottom antiferromagnetic layer of the MTJ device.

In the present invention, the bottom electrode structure further includes a relative thin conductive liner layer intermediate the bulk metal conductive liner and the cap layer and extending over the dielectric surface prior to exposing the substrate to the planarization process. The conductive liner can be deposited in situ when depositing the capping layer, thereby minimizing process time.

The conductive liner is a material selected to be harder than the cap layer and consequently is more resistant to the chemical mechanical planarization process. By way of example, a cap layer formed of tantalum nitride has a reported hardness greater than about 12 gigapascals (GPa) depending on the nitrogen concentration. The conductive liner is selected to have a hardness greater than the tantalum nitride as deposited, i.e., greater than 12 GPa in this example.

The methods and structures as described herein address the problems associated in the prior art by providing a substantially flat bottom electrode surface coplanar to the adjacent surfaces of the dielectric layer with minimal or no dielectric dishing, which is a significant advantage over the prior art. As used herein, the term flat refers to a height differential between the planar surface of the cap layer and the dielectric layer, wherein the height differential is less than about 3 nm in one or more embodiments, less than 2 nm in one or more other embodiments, and less than 1 nm in still other embodiments, which represents a marked improvement over the prior art.

Figure 5:
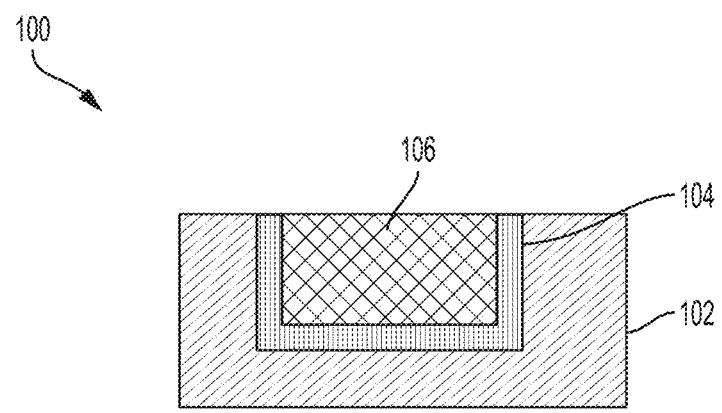
FIG. 5 is a schematic cross sectional view depicting an initial bottom electrode structure including a conductive layer formed in a dielectric layer.

Referring now to FIG. 5, a structure 100 is provided. The structure 100 includes a dielectric layer 102 including a patterned feature lined with a barrier layer 104 and filled with a bulk conductor 106 such as copper, aluminum, tantalum, tungsten, tantalum nitride (TaN), titanium, titanium nitride (TiN), the like, and/or a combination thereof. As shown, the surface of structure has been planarized using a process such as CMP. As noted above, the CMP process generally includes polishing the top surface and stopping at the dielectric layer to remove the metal overburden that was deposited during deposition of the bulk conductor. The particular CMP process is not intended to be limited and will generally depend on the materials used.

The dielectric layer 102 can be any interlevel or intralevel dielectrics utilized at the back end of line (BEOL). As used herein, BEOL generally begins when the first layer of metal is deposited on the wafer. As such, BEOL typically includes contacts, insulating layers, metal levels, and bonding sites for chip-to-package connections. The dielectric layers used in the BEOL can include inorganic dielectrics or organic dielectrics and the planar capacitor structure and method of formation can advantageously be inserted at any level of the BEOL.

The dielectric layer 102 can be porous or non-porous. Examples of suitable dielectrics that can be used as the dielectric layer 102 include, but are not limited to, SiO2, silsesquioxanes, C doped oxides (i.e., organosilicates) that include atoms of Si, C, O and H, thermosetting polyarylene ethers, or multilayers thereof. The term "polyarylene" is used in this application to denote aryl moieties or substituted aryl moieties which are linked together by bonds, fused rings, or inert linking groups such as, for example, oxygen, sulfur, sulfone, sulfoxide, carbonyl and the like.

In one or more embodiments, the dielectric layer 102 has a dielectric constant of about 4.0 or less. In other embodiments, the dielectric layer 102 has a dielectric constant of about 2.8 or less. These dielectrics generally have a lower parasitic crosstalk as compared with dielectric materials that have a dielectric constant higher than 4.0. The dielectric constants mentioned herein are measured in a vacuum.

The barrier layer 104 can be formed of a metal such as tantalum, titanium, tungsten, tungsten nitride, nickel, platinum, ruthenium, cobalt, or the like. The barrier layer 104 prevents electromigration there through. In one or more embodiments, the barrier layer is formed of ruthenium. In one or more embodiments, the barrier layer is formed of cobalt or Ta or W or Ru. In one or more embodiments, the barrier layer 110 can be at a thickness of 1 nm to 20 nm, although greater or less thicknesses can be used.

The bulk metal conductor 106 can be formed utilizing a conventional deposition process such as, for example, PVD, CVD, PECVD, an atomic layer deposition (ALD) process, or a plasma enhanced atomic layer deposition (PEALD). In one or more embodiments, the bulk metal conductor is copper.

Figure 6:
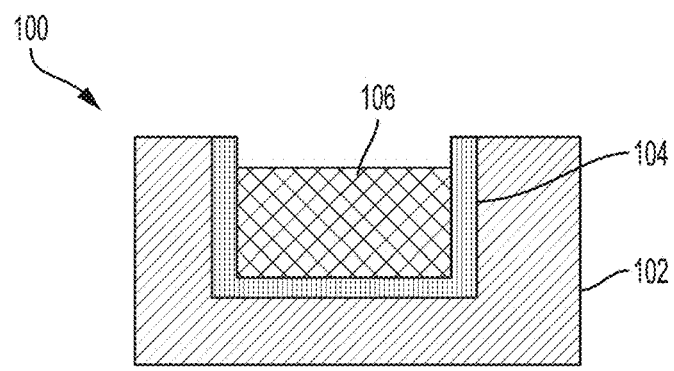
FIG. 6 is a schematic cross sectional view of the bottom electrode structure of FIG. 5 subsequent to metallization recess of the conductive layer.

In FIG. 6, the substrate 100 is subjected to a wet etch process to recess the metal bulk conductor as shown. By way of example, $CH_3COOH/NH_4F$ or $CCl_4/DMSO$ etchants can be used for selectively removing a portion of the metal conductor 106 to form the recess. In one or more embodiments, the recess can be from about 5 to 80 nm in height.

Figure 7:
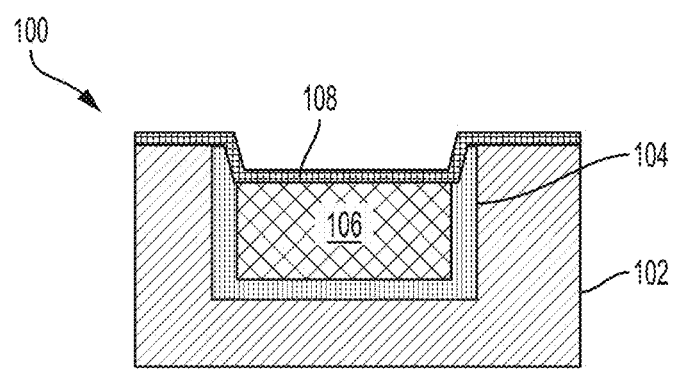
FIG. 7 is a schematic cross sectional view of the bottom electrode structure of FIG. 6 subsequent to blanket deposition of a conductive liner layer in accordance with one or more embodiments of the present invention.

Referring now to FIG. 7, a relatively thin conductive liner 108 is deposited onto the substrate. The conductive liner can be conformal or non-conformal so long as sidewall coverage is provided. As noted above, the thin conductive liner material is a material selected to be harder than the subsequently deposited cap layer. By way of example, the thin conductive liner can be a material selected from the group consisting of rhodium, palladium, platinum, osmium, ruthenium (Ru), combinations thereof, and combinations including at least one of the foregoing. In one or more embodiments, the conductive liner is Ru. In one or more embodiments, the thickness of the conductive layer 108 is from 0.5 nm to about 50 nm; 1 to about 20 nm in one or more other embodiments, and about 1 to 10 nm in still other embodiments.

Figure 8:
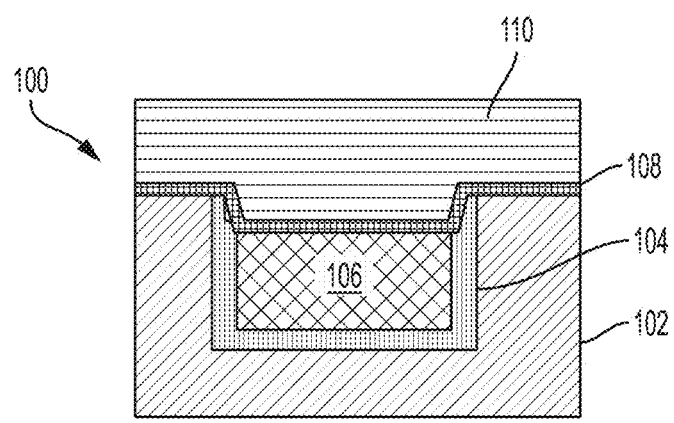
FIG. 8 is a schematic cross sectional view of the bottom electrode structure of FIG. 7 subsequent to blanket deposition of a metal nitride cap layer in accordance with one or more embodiments of the present invention.

In FIG. 8, the cap layer 110 is then blanket deposited onto the substrate 100 as shown. The cap layer can be tantalum nitride (Ta/TaN), titanium nitride (Ti/TiN), tungsten nitride (W/WN), ruthenium/ruthenium nitride (Ru/RuN), cobalt nitride (CoN), platinum (Pt)-group metal nitrides, or the like. The cap layer 110 can be deposited by a deposition process such as, for example, atomic layer deposition (ALD), chemical vapor deposition (CVD), plasma enhanced chemical vapor deposition (PECVD), sputtering, chemical solution deposition, successive ionic layer adsorption and reaction (SILAR), plating or the like. The deposition is self-aligned to the recess in the conductor.

Figure 9:
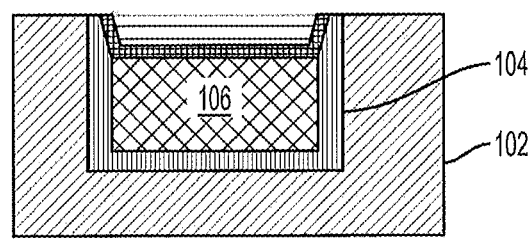
FIG. 9 is a schematic cross sectional view of the bottom electrode structure of FIG. 8 subsequent to planarization to provide a substantially flat and coplanar surface of bottom electrode structure and dielectric layer.

In FIG. 9, the substrate is subjected to a planarization process. The presence of the thin conductive liner that is harder than the material selected for the cap layer results in a flatter surface with minimal dielectric dishing.

Subsequent to planarization, the MTJ stack is disposed on the bottom electrode. The MTJ stack (not shown) generally includes an anti-ferromagnetic layer, a pinning layer, and a free layer. However, it should be recognized that different magnetic tunnel junction layers can also be present in practical applications. For example, magnetic tunnel junction layers can include a tunnel barrier layer. In addition, more or fewer magnetic tunnel junction layers can be incorporated into the MRAM device.

The reference layer and the free layer include conductive, magnetic metals or metal alloys. The free layer and the reference layer are magnetically de-coupled by the tunnel barrier, wherein the free layer has a variable magnetization direction, and the reference layer has an invariable magnetization direction. The layers of the MTJ stack can be formed by sputter-deposition techniques with deposition rates in the Ångstrom-per-second range using for example, vapor deposition, specifically planar magnetron sputtering, and ion-beam deposition.

A top electrode is formed over the MTJ stack layers. In one or more embodiments, the top electrode layer is formed on the free layer Like the bottom electrode layer, the top electrode layer can be copper, aluminum, tantalum, tungsten, tantalum nitride (TaN), titanium, titanium nitride (TiN), the like, and/or a combination thereof. The top electrode layer can be formed by acceptable deposition techniques, such as chemical vapor deposition (CVD), atomic layer deposition (ALD), physical vapor deposition (PVD), the like, and/or a combination thereof. The bottom (bulk conductor) and top electrodes can be the same or different.

While the present invention has been particularly shown and described with respect to preferred embodiments, it will be understood by those skilled in the art that the foregoing and other changes in forms and details can be made without departing from the spirit and scope of the invention. It is therefore intended that the present invention not be limited to the exact forms and details described and illustrated but fall within the scope of the appended claims.

What is claimed is:

1. A process of forming a bottom electrode in a magnetoresistive random access memory (MRAM) device, the process comprising:

providing a structure comprising a dielectric layer including a patterned feature lined with a barrier layer and a metal conductor;

planarizing a surface of the structure stopping at the dielectric layer to remove an overburden of the metal conductor;

forming a recess in the metal conductor;

depositing a conductive liner material in the recess of the metal conductor and on the dielectric layer;

depositing tantalum nitride cap layer in the recess on the conductive liner material and on the dielectric layer; and polishing the tantalum nitride cap layer to the dielectric layer with a chemical mechanical planarization process to form the bottom electrode, wherein a height differential between upper surfaces of the tantalum nitride cap layer and the dielectric layer is less than 3 nanometers, wherein the conductive liner material is harder than the tantalum nitride.

2. The process of claim 1, wherein the conductive liner material comprises ruthenium.

3. The process of claim 1, wherein the conductive liner material comprises ruthenium, rhodium, or combinations comprising at least one of the foregoing.

4. The process of claim 1, wherein the conductive liner material has a lower chemical mechanical planarization removal rate than the tantalum nitride.

5. The process of claim 1, wherein the metal conductor comprise copper, aluminum, tantalum, tungsten, tantalum nitride (TaN), titanium, titanium nitride (TiN), and/or a combination thereof.

6. The process of claim 1, wherein the conductive liner material is at a thickness of 1 to 10 nanometers.

7. The process of claim 1, wherein the conductive liner has a hardness greater than about 12 gigapascals.

8. The process of claim 1, wherein the conductive liner material is at a thickness of 0.5 nanometers to 50 nanometers.

9. The process of claim 1, wherein the conductive liner material is at a thickness of 1 nanometer to 20 nanometers.

10. The process of claim 1, wherein depositing the conductive liner material in the recess conductive liner comprises conformally depositing the conductive liner material.

11. The process of claim 1, wherein the height differential between the tantalum nitride surface and the dielectric layer surface is less than 2 nanometers.

12. The process of claim 1 wherein a height differential between the tantalum nitride surface and the dielectric layer surface is less than 1 nanometer.

13. The process of claim 1, wherein the conductive liner is deposited in situ when depositing the tantalum nitride capping layer.

* * * * *